(12) United States Patent
Jeon et al.

(10) Patent No.: US 9,013,944 B2
(45) Date of Patent: Apr. 21, 2015

(54) AUXILIARY POWER DEVICE AND USER SYSTEM INCLUDING THE SAME

(71) Applicant: Samsung Electronics Co., Ltd, Suwon-si, Gyeonggi-do (KR)

(72) Inventors: Sang Hun Jeon, Suwon-si (KR); Cheol Kwon, Suwon-si (KR); Yeongkyun Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/064,376

(22) Filed: Oct. 28, 2013

(65) Prior Publication Data
US 2014/0169115 A1 Jun. 19, 2014

(30) Foreign Application Priority Data

Dec. 18, 2012 (KR) ........................ 10-2012-0148760

(51) Int. Cl.
*G11C 7/00* (2006.01)
*G11C 5/14* (2006.01)
(52) U.S. Cl.
CPC ..................................... *G11C 5/141* (2013.01)
(58) Field of Classification Search
CPC .................................. G11C 5/14; G11C 5/147
USPC ................................................ 365/226, 229
See application file for complete search history.

(56) References Cited

U.S. PATENT DOCUMENTS

| 4,890,005 | A | 12/1989 | Schornack |
| 4,984,211 | A | 1/1991 | Tran |
| 5,717,936 | A | 2/1998 | Uskali |
| 5,892,393 | A | 4/1999 | Yamashita |
| 6,496,939 | B2 | 12/2002 | Portman et al. |
| 6,552,934 | B2 * | 4/2003 | Roohparvar ............. 365/185.18 |
| 6,611,067 | B2 * | 8/2003 | Akiba ............................. 307/39 |
| 6,894,405 | B2 | 5/2005 | Yuan |
| 6,981,159 | B2 | 12/2005 | Maeda |
| 7,480,811 | B2 | 1/2009 | Chou et al. |
| 7,706,204 | B2 * | 4/2010 | Choi et al. ..................... 365/226 |
| 7,802,121 | B1 | 9/2010 | Zansky et al. |
| 8,004,923 | B2 * | 8/2011 | Akiyama et al. .............. 365/226 |
| 8,546,777 | B2 * | 10/2013 | Utsunomiya ................. 250/580 |
| 8,836,350 | B2 * | 9/2014 | Peter ............................. 324/684 |

(Continued)

FOREIGN PATENT DOCUMENTS

| JP | 2009-048366 | 3/2009 |
| KR | 10-0315771 | 11/2001 |

(Continued)

*Primary Examiner* — Michael Tran
(74) *Attorney, Agent, or Firm* — Ellsworth IP Group PLLC

(57) ABSTRACT

A user system is provided which includes a storage device and an auxiliary power device configured to supply a power to the storage device, wherein the auxiliary power device includes a first one direction device configured to supply a supply voltage from an external power supply to the storage device, a charging unit configured to be charged by the external power supply, a second one direction device configured to selectively supply an output voltage of the charging unit to the storage device, a voltage detector configured to detect a level of the output voltage of the charging unit and to output a first control signal to the storage device, and a switching unit connected between the charging unit and the second one direction device and configured to operate in response to a second control signal from the storage device.

19 Claims, 4 Drawing Sheets

(56) References Cited

U.S. PATENT DOCUMENTS

| | | |
|---|---|---|
| 2011/0031811 A1 | 2/2011 | Park et al. |
| 2011/0055614 A1 | 3/2011 | Lin et al. |
| 2011/0214002 A1 | 9/2011 | Kitamrua |
| 2012/0117409 A1 | 5/2012 | Lee et al. |

FOREIGN PATENT DOCUMENTS

| | | |
|---|---|---|
| KR | 10-2005-0006353 | 1/2005 |
| KR | 10-2010-0066000 | 6/2010 |
| KR | 10-2010-0108821 | 10/2010 |
| KR | 10-2010-0116940 | 11/2010 |
| KR | 10-2012-0020791 | 3/2012 |

* cited by examiner

AUXILIARY POWER DEVICE AND USER SYSTEM INCLUDING THE SAME

CROSS-REFERENCE TO RELATED APPLICATIONS

This application claims the benefit of priority under 35 U.S.C. §119 to Korean Patent Application No. 10-2012-0148760, filed Dec. 18, 2012, in the Korean Intellectual Property Office, the content of which is incorporated herein in its entirety by reference.

BACKGROUND

1. Field

An embodiment of the inventive concepts described herein relates to a semiconductor memory device, and more particularly, relates to an auxiliary power device and a user device that includes the same.

2. Description of the Related Art

A semiconductor memory device may be a memory device which stores data using semiconductor elements. Semiconductor memory devices may be divided into volatile memory devices such as, for example, a DRAM, an SRAM, and so on, and nonvolatile memory devices such as, for example, an EEPROM, an FRAM, a PRAM, an MRAM, a flash memory, and so on. While a volatile memory device may lose data stored therein during a loss of power, a nonvolatile memory device may retain data stored therein even during a loss of power.

In recent years, the integration of semiconductor memory devices may have been improved with development of semiconductor integration technology. Thus, the capacity of semiconductor memory devices may have increased. In particular, a flash user system may be widely used as a storage medium for a computing system by virtue of such merits as a fast programming speed, a mass storage capacity, and so on.

To improve the capacity and operating speed of the flash user system, a plurality of flash memory devices may be overlapped. In this case, the power used may exceed an allowable power of a power supply device of a host connected to a flash memory device. This may cause the power of the host and the flash memory device to become unstable. Operation of the flash memory device may be limited by the unstable power. Thus, performance of the flash user system may be overall reduced.

SUMMARY

The present general inventive concept provides a user system usable with an auxiliary power device to supply additional power to a plurality of devices.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a user system comprising a storage device and an auxiliary power device configured to supply a power to the storage device, wherein the auxiliary power device comprises a first one direction device configured to supply a supply voltage from an external power supply to the storage device, a charging unit configured to be charged by the external power supply, a second one direction device configured to selectively supply an output voltage of the charging unit to the storage device, a voltage detector configured to detect a level of the output voltage of the charging unit and to output a first control signal, and a switching unit connected between the charging unit and the second one direction device and configured to operate in response to a second control signal from the storage device, wherein the storage device is configured to output the second control signal to the switching unit in response to the first control signal.

In an example embodiment, the switching unit may be configured to be turned on in response to the second control signal when the charging unit is charged up to a charging reference voltage.

In an example embodiment, when the level of the output voltage of the charging unit is higher than a level of the supply voltage, the second one direction device may be configured to supply a power stored in the charging unit to the storage device.

In an example embodiment, the switching unit may be configured to be turned off in response to the second control signal when the output voltage of the charging unit is lower than a first reference voltage.

In an example embodiment, the charging reference voltage may be higher than the first reference voltage, the first reference voltage may be higher than a second reference voltage, and the second reference voltage may be a minimum voltage for an end operation or a shutdown of the storage device at a sudden power-off or during a loss of power.

In an example embodiment, the switching unit may be configured to remain turned on during the sudden power-off or loss of power.

In an example embodiment, the switching unit may be configured to turn off when the end operation or the shutdown of the storage device performed during the sudden power-off or the loss of power has been completed.

In an example embodiment, when the supply voltage is again supplied after the sudden power-off or the loss of power, the charging unit may be configured to charge up to the charging reference voltage.

In an example embodiment, the user system may further comprise a charging circuit configured to selectively adjust a level of the charging reference voltage based on an operating voltage of the storage device.

An embodiment of the present inventive concept is directed to provide an auxiliary power device comprising a charging unit configured to be charged up to a charging reference voltage by an external power supply, a first one direction device configured to supply a supply voltage from the external power supply to an external device, a second one direction device configured to selectively supply an output voltage of the charging unit to the external device, a first voltage detector configured to detect a voltage level of the charging unit and to output a first control signal, and a switching unit connected between the charging unit and the second one direction device and configured to operate in response to the first control signal of the first voltage detector In an example embodiment, the first one direction device may be further configured to block a current from the external device to the external power supply.

In an example embodiment, the second one direction device may be further configured to block a current from the external device to the charging unit.

In an example embodiment, the switching unit may be further configured to receive a second control signal from the external device and to operate in response to the second control signal.

In an example embodiment, the auxiliary power device may further comprise a second voltage detector configured to detect a voltage level of the supply voltage and to output a third control signal.

In an example embodiment, the external device may be a memory controller.

An embodiment of the present inventive concept is directed to provide a method of providing power to a semiconductor device comprising charging a voltage of a charging unit to a first reference voltage, sending, to the semiconductor device, a first signal corresponding to a level of the voltage of the charging unit, shutting a switch in response to a second signal received from the semiconductor device, and causing a current to flow from the charging unit to the semiconductor device when the switch is shut and the voltage of the charging unit is higher than a supply voltage provided to the semiconductor device.

In an example embodiment, the method may further comprise opening the switch in response to the second signal when the voltage of the charging unit is lower than a second reference voltage, wherein the shutting the switch comprises shutting the switch in response to the second signal when the voltage of the charging unit is at the first reference voltage, wherein the second reference voltage is lower than the first reference voltage.

In an example embodiment, the method may further comprise determining a driving voltage of the semiconductor device.

In an example embodiment, the method may further comprise preventing the current from flowing from the semiconductor device to the charging unit when the switch is shut and the voltage of the charging unit is lower than the driving voltage.

In an example embodiment, the method may further comprise sending, to the semiconductor device, a third signal corresponding to a level of the supply voltage.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
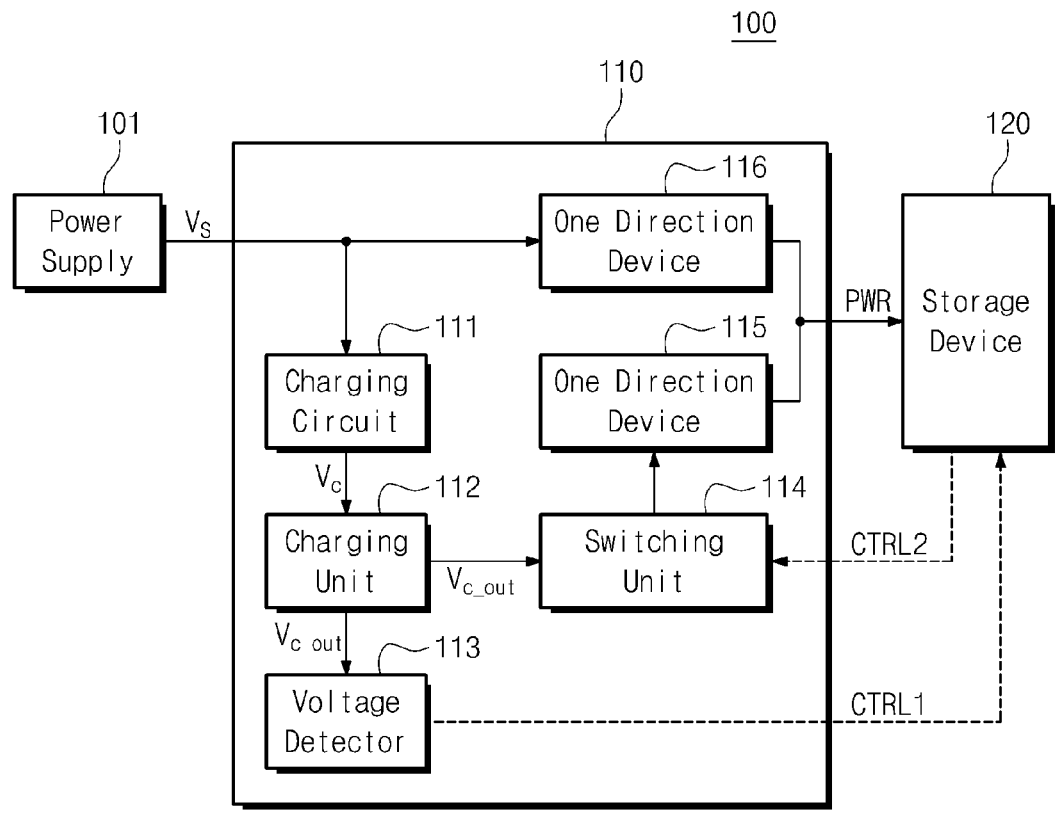
FIG. 1 is a schematic block diagram schematically illustrating a user system according to an embodiment of the inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A user system may be supplied with power from an external device or from a power supply included in the user system. When the power required by a plurality of devices (e.g., a storage device, an input device, an output device, etc.) included in the user system is greater than a predetermined level, performance of the user system may be reduced. That is, the reliability of the user system may be degraded. In this case, an auxiliary power device, according to the general inventive concept, may supply additional power to the plurality of devices included in the user system.

For ease of description, it is assumed that a device included in the user system is a storage device based on a NAND flash memory. However, the general inventive concept is not limited thereto. A device included in the user system may be one of several devices (e.g., MRAM, RRAM, DRAM, SRAM, HDD, graphic card, etc.) that are included in the user system or that are electrically connected thereto in order to be supplied with power.

FIG. 1 is a schematic block diagram illustrating a user system 100 according to an embodiment of the inventive concept. Referring to FIG. 1, the user system 100 may include a power supply 101, an auxiliary power device 110, and a storage device 120. The user system 100 may be implemented by a computing system such as a personal computer, a notebook computer, a smart phone, a PDA, a camera, and so on. The user system 100 may, for example, be a device included in a computing system, or electrically connected thereto, such as a storage device, an input device, an output device, and so on. The user system 100 may be supplied with required power from the power supply 101. The power supply 101 may be supplied with power from an external device to generate a supply voltage $V_s$ required by the user system 100. The power supply 101 may, for example, be placed outside the user system 100.

The auxiliary power device 110 may be charged by the supply voltage $V_s$ supplied from the power supply 101. The auxiliary power device 110 may supply additional power when the level of power required by the storage device 120 is greater than the predetermined level. The auxiliary power device 110 may supply additional power so that the reliability of an end operation or a shutdown of the storage device 120 performed during a sudden power-off (SPO) of or a loss of power from the power supply 101 may be secured.

The auxiliary power device 110 may include a charging circuit 111, a charging unit 112, a voltage detector 113, a switching unit 114, and first and second one direction devices 115 and 116. The charging circuit 111 may charge the charging unit 112 using power supplied from the power supply 101. A charging voltage $V_c$ used to charge the charging unit 112 may be adjusted selectively according to a range of a driving voltage used at the storage device 120. For example, if the storage device 120 operates based on a first reference voltage Vref1, the charging unit 112 may be charged by a second reference voltage Vref2 that is higher than the first reference voltage Vref1. As the charging unit 112 is charged by the second reference voltage Vref2, the reliability of an end operation or a shutdown of the storage device 120 performed during a sudden power-off (SPO) of or loss of power from the power supply 101 may be secured.

The charging unit 112 may supply additional power to the storage device 120 through the switching unit 114 and the one direction device 115 when the level of power required by the storage device 120 is greater than the predetermined level. The charging unit 112 may supply power so that an end operation or a shutdown of the storage device 120 performed at the SPO or during a sudden loss of power may be completed.

The voltage detector 113 may sense an output voltage $V_{c\_out}$ of the charging unit 112. The voltage detector 113 may output a first control signal CTRL1 based on the sensed output voltage $V_{c\_out}$. For example, at an initial operation of the auxiliary power device 110, the charging unit 112 may not be at a state where it is charged by the charging reference voltage $V_{c\_ref}$. In this case, the voltage detector 113 may send the first control signal CTRL1 to the storage device 120. The first control signal CTRL1 may be a signal indicating a charging state of the charging unit 112. The storage device 120 may output a second control signal CTRL2 in response to the first control signal CTRL1 so that the switching unit 114 is turned off.

In the event that the charging unit 112 is charged by the charging reference voltage $V_{c\_ref}$, the voltage detector 113 may send the first control signal CTRL1 to the storage device 120. The storage device 120 may control the second control signal CTRL2 in response to the first control signal CTRL1 so that the switching unit 114 is turned on.

If the output voltage $V_{c\_out}$ of the charging unit 112 is lower than the second reference voltage Vref2, the voltage detector 113 may send the first control signal CTRL1 to the storage device 120. The storage device 120 may control the second control signal CTRL2 so that the switching unit 114 is turned off. The second reference voltage Vref2 may be higher than the first reference voltage Vref1. The first reference voltage Vref1 may indicate a minimum voltage level required at an SPO operation or for a sudden loss of power.

The switching unit 114 may be connected between the charging unit 112 and the first one direction device 115. The switching unit 114 may transfer power stored in the charging unit 112 to the first one direction device 115. For example, if the output voltage $V_{c\_out}$ of the charging unit 112 is higher than the second reference voltage Vref2, the switching unit 114 may remain turned on so that power stored in the charging unit 112 is transferred to the first one direction device 115. If the output voltage $V_{c\_out}$ of the charging unit 112 is lower than the second reference voltage Vref2, the switching unit 114 may be turned off by the second control signal CTRL2 from the storage device 120. Afterwards, as the charging unit 112 is charged, the output voltage $V_{c\_out}$ may become higher than the second reference voltage Vref2. In this case, the switching unit 114 may again be turned on so that power stored in the charging unit 112 is transferred to the first one direction device 115.

The first one direction device 115 may be connected between the switching unit 114 and an input stage of the storage device 120. The first one direction device 115 may provide additional power from the switching unit 114 to the input stage of the storage device 120. The additional power may be power stored in the charging unit 112. The first one direction device 115 may also block power from being supplied from the switching unit 114 to the input stage of the storage device 120.

The first one direction device 115 may selectively supply additional power through the switching unit 114 from the charging unit 112 to the storage device 120. For example, in the event that the switching unit 114 is turned on, the voltage at one end of the first one direction device 115 that is connected with the switching unit 114 may be the output voltage $V_{c\_out}$ of the charging unit 112. The voltage at the other end of the first one direction device 115 may be the supply voltage $V_s$ of the power supply 101. If the supply voltage $V_s$ of the power supply 101 is lower than the output voltage $V_{c\_out}$ of the charging unit 112, the first one direction device 115 may supply the additional power from the charging unit 112 to the storage device 120 through the switching unit 114. If the supply voltage $V_s$ of the power supply 101 is higher than the output voltage $V_{c\_out}$ of the charging unit 112, the first one direction device 115 may block the additional power from being supplied to the storage device 120.

Sometimes an increase in the power required by the storage device 120 causes the supply voltage $V_s$ of the power supply 101 to decrease. If the level of power required by the storage device 120 is greater than the predetermined level, the supply voltage $V_s$ of the power supply 101 may become lower than the output voltage $V_{c\_out}$ of the charging unit 112.

The second one direction device 116 may be connected between the power supply 101 and an input stage of the storage device 120. The second one direction device 116 may provide power supplied from the power supply 101 to the storage device 120. The second one direction device 116 may also block power from being transferred from the storage device 120 back to the power supply 101. For example, the first and second one direction devices 115 and 116 may each be implemented as a diode.

The storage device 120 may be a memory device including, for example, a plurality of flash memory devices. The storage device 120 may perform operations (e.g., data writing, reading and erasing operations) using a power PWR from the auxiliary power device 110. For example, the storage device 120 may collectively control operations of the flash memory devices. In the event that operations of the flash memory devices are performed at the same time, power required by the storage device 120 may increase. If the level of power required by the storage device 120 is greater than the predetermined level, the storage device 120 may be supplied with additional power from the auxiliary power device 110.

The user system 100 may compensate for a peak power by using the auxiliary power device 110. Also, the user system 100 may stably perform an end operation or a shutdown of the storage device 120 using the auxiliary power device at sudden power-off or during a sudden loss of power.

Figure 2:
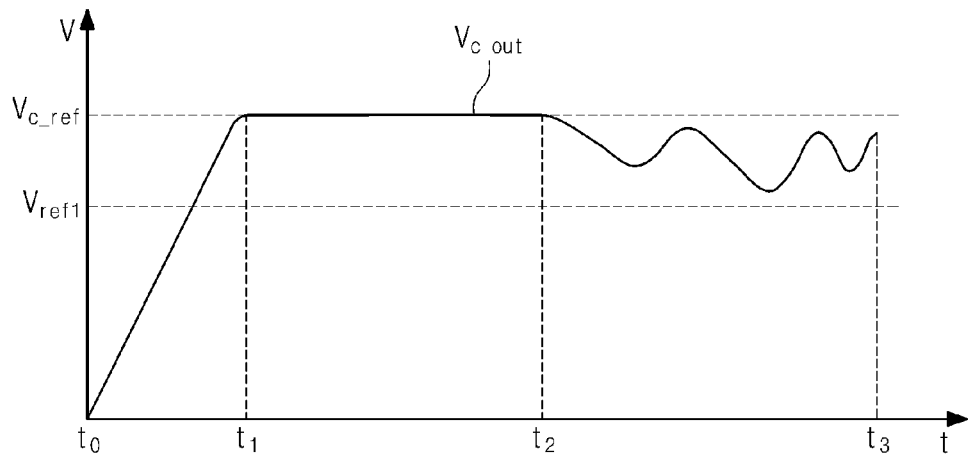
FIG. 2 is a graph illustrating an example of an operation of an auxiliary power device according to an embodiment of the inventive concept.

FIG. 2 is a graph illustrating an example of an operation of the auxiliary power device 110 according to an embodiment of the inventive concept. In FIG. 2, a horizontal axis may indicate a time (t), and a vertical axis may indicate an output voltage $V_{c\_out}$ of the auxiliary power device 110.

Referring to FIG. 2, the auxiliary power device 110 may be charged during a first period t0 to t1. For example, at t0, the user system 100 may be turned on. During the first period t0 to t1, the auxiliary power device 110 may be charged by power from the power supply 101 up to the charging reference voltage $V_{c\_ref}$. For example, the switching unit 114 may remain turned off until the auxiliary power device 110 is charged up to the charging reference voltage $V_{c\_ref}$ during the first period t0 to t1.

At t1, the auxiliary power device 110 may be charged up to the charging reference voltage $V_{c\_ref}$. During a second period t1 to t2, the switching unit 114 of the auxiliary power device 110 may remain turned on. Since the level of power used by the storage device 120 during the second period t1 to t2 is less than the predetermined level, additional power may not be provided from the auxiliary power device 110. The auxiliary power device 110 may remain at the level of the charging reference voltage $V_{c\_ref}$.

Power required by the storage device 120 may increase during a third period t2 to t3. For example, power required by the storage device 120 may increase when operations (e.g., data reading, writing and erasing operations) of flash memory devices included in the storage device 120 are performed at the same time. In this case, the auxiliary power device 110 may supply additional power to the storage device 120. For example, in the event that the output voltage $V_{c\_out}$ of the auxiliary power device 110 is higher than the supply voltage $V_s$ of the power supply 101, the auxiliary power device 110 may supply additional power to the storage device 120.

Since the auxiliary power device 110 supplies the additional power based on the charged power, referring to the third period t2 to t3 illustrated in FIG. 2, a ripple may be generated at the output voltage $V_{c\_out}$ of the auxiliary power device 110. For example, if the output voltage $V_{c\_out}$ of the auxiliary power device 110 becomes lower than the second reference voltage Vref2, the switching unit 114 may be turned off.

Figure 3:
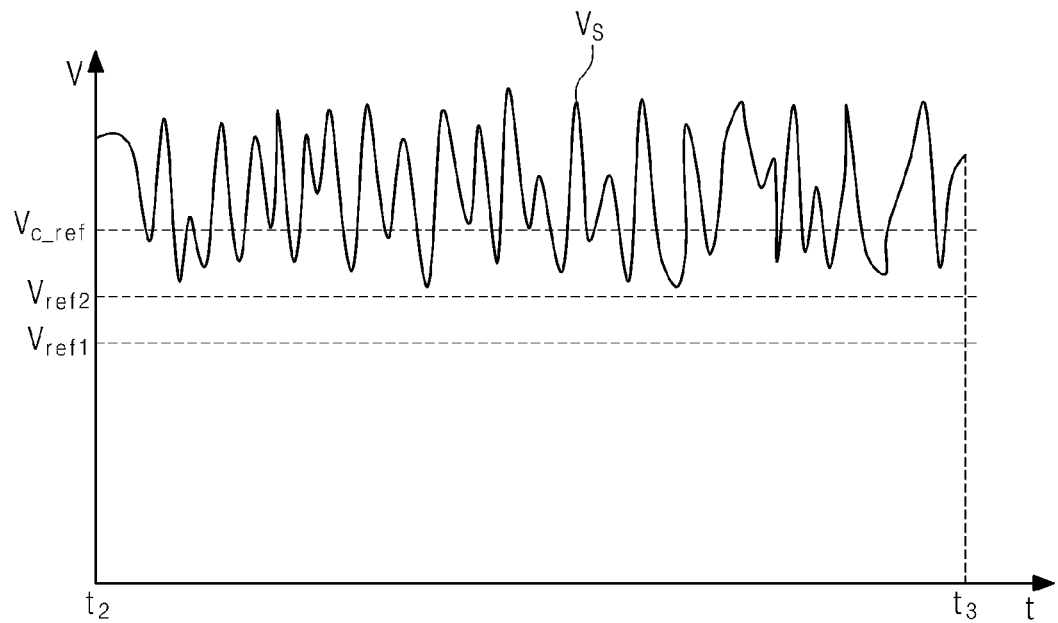
FIG. 3 is a graph illustrating an example of a supply voltage of a power supply to describe in detail an example of an operation of an auxiliary power device during the third period as illustrated in FIG. 2.

FIG. 3 is a graph illustrating an example of a supply voltage $V_s$ of a power supply 101 to describe in detail an example of an operation of the auxiliary power device 110 during the third period t2 to t3 as illustrated in FIG. 2. It is assumed that the storage device 120 requires a power level greater than the predetermined level periodically or randomly during the third period t2 to t3.

Referring to FIG. 3, the storage device 120 may be supplied with power from the power supply 101. The ripple may be generated in the supply voltage $V_s$ in response to the level of power required by the storage device 120. In the event that the supply voltage $V_s$ is lower than the charging reference voltage $V_{c\_ref}$ of the auxiliary power device 110, the auxiliary power device 110 may supply additional power. For example, at t2, the auxiliary power device 110 may be in a state where it is charged up to the charging reference voltage $V_{c\_ref}$. As power required by the storage device 120 increases, the supply voltage $V_s$ may become lower than the charging reference voltage $V_{c\_ref}$. In this case, the auxiliary power device 110 may supply additional power to the storage device 120. At this time, the ripple in the supply voltage $V_s$ supplied from the power supply 101 may be reduced. Thus, the reliability and performance of the user system 100 may be improved.

Figure 4:
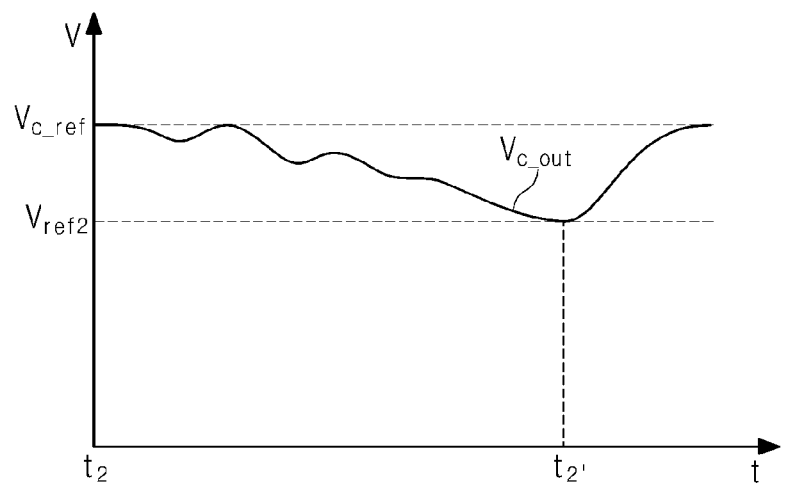
FIG. 4 is a graph illustrating an example of a variation of an output voltage of an auxiliary power device according to an embodiment of the inventive concept.

FIG. 4 is a graph illustrating an example of a variation of an output voltage $V_{c\_out}$ of the auxiliary power device 110 according to an embodiment of the inventive concept. Referring to FIG. 4, at t2, the auxiliary power device 110 may be in a state where it is charged up to the charging reference voltage $V_{c\_ref}$. That is, at t2, the output voltage $V_{c\_out}$ of the auxiliary power device 110 may be equal to the charging reference voltage $V_{c\_ref}$. Between t2 and t2', the storage device 120 may require a power level greater than the predetermined level periodically or randomly. If the level of power required by the storage device 120 is greater than the predetermined level during a period t2 to t2', the auxiliary power device 110 may supply additional power. In this case, as illustrated in FIG. 4, the output voltage $V_{c\_out}$ of the auxiliary power device 110 may decrease.

At t2', the auxiliary power device 110 may supply additional power to the storage device 120 so that the output voltage $V_{c\_out}$ is lower than the second reference voltage Vref2. The second reference voltage Vref2 may indicate a voltage level for securing the stability of an end operation or a shutdown of the storage device 120 during a sudden power-off or loss of power.

After t2', the auxiliary power device 110 may stop supplying additional power to the storage device 120. During a period t2' to t3, the auxiliary power device 110 may be charged up to the charging reference voltage $V_{c\_ref}$.

The auxiliary power device 110, according to the inventive concept, may secure supplying additional power to the storage device 120 and the stability of an end operation or a shutdown of the storage device 120.

Figure 5:
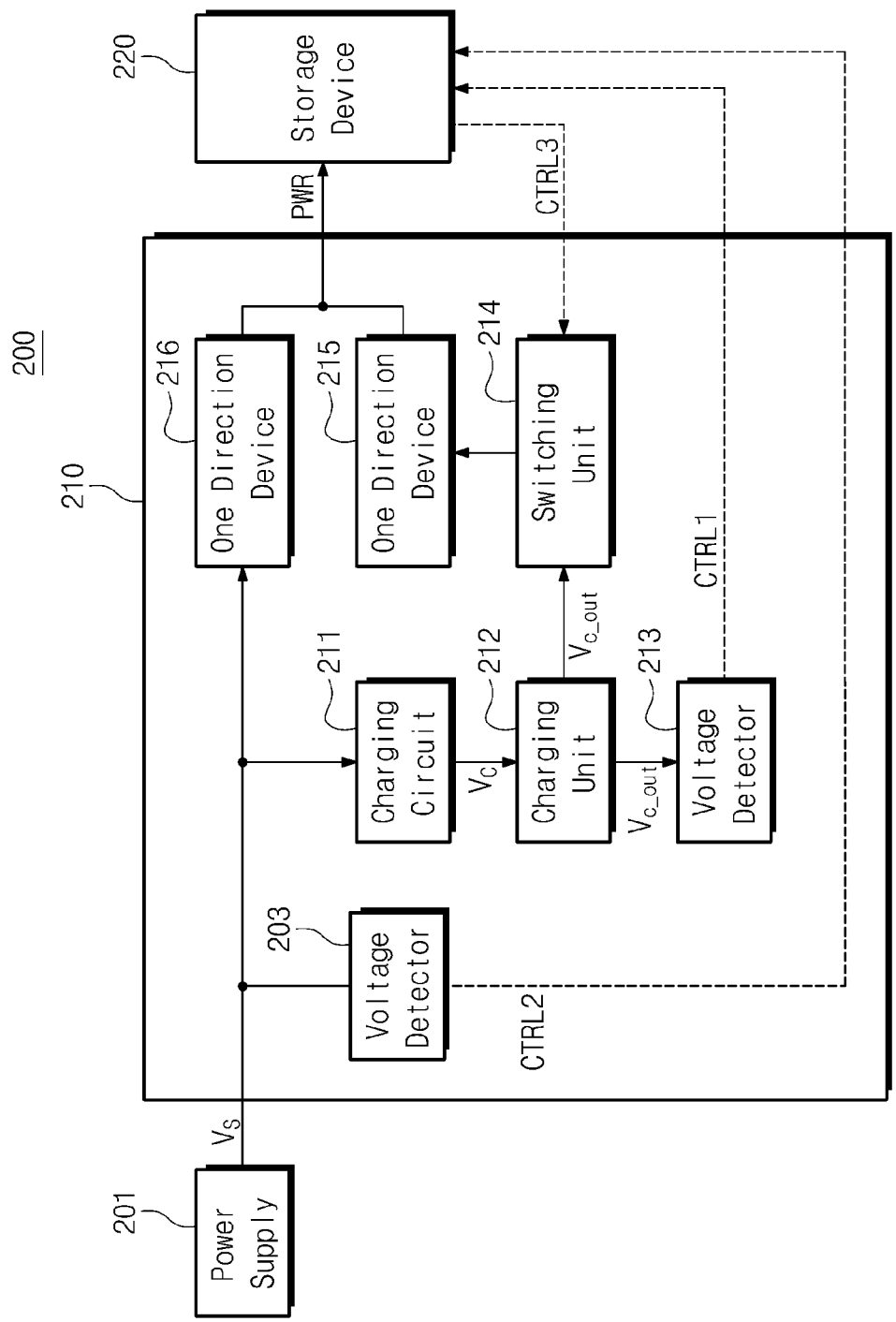
FIG. 5 is a schematic block diagram illustrating a user system according to another embodiment of the inventive concept.

FIG. 5 is a schematic block diagram illustrating a user system according to another embodiment of the inventive concept. Referring to FIG. 5, a user system 200 may include a power supply 201, an auxiliary power device 210, and a storage device 220. The auxiliary power device 210 may include a charging circuit 211, a charging unit 212, a first voltage detector 213, a second voltage detector 203, a switching unit 214, and first and second one direction devices 215 and 216. The components 211, 212, 215 and 216 of FIG. 5 may be substantially the same as those in FIG. 1, and a description thereof is thus omitted.

The switching unit 214 of the auxiliary power device 210 may operate responsive to a control of the storage device 220. For example, the first voltage detector 213 may detect the output voltage $V_{c\_out}$ of the charging unit 212, and may send the first control signal CTRL1 to the storage device 220 according to a result of the voltage detection. The first control signal CTRL1 may be a signal indicating the charging state of the charging unit 212. The second voltage detector 203 may detect the supply voltage $V_s$ of the power supply 201 to output a second control signal CTRL2. The storage device 220 may control the switching unit 214 in response to the first and second control signals CTRL1 and CTRL2. During a sudden power-off or loss of power, the storage device 220 may perform an end operation or a shutdown in response to the second control signal CTRL2. After the end operation or shutdown has been completed, the storage device 220 may output a third control signal CTRL3. The switching unit 214 may be turned off by the third control signal CTRL3.

The auxiliary power device 210 may supply additional power to the storage device 220 in the same manner as does the auxiliary power device 110 in FIG. 1. For example, at sudden power-off of or loss of power from the power supply 201, the storage device 220 may perform an end operation or a shutdown. After the end operation or shutdown of the storage device 220 has been completed, the storage device 220 may output the third control signal CTRL3 so that the switching unit 214 is turned off. Having the switching unit 214 turned off after the end operation or shutdown of the storage device 220 has been completed may prevent an unnecessary discharge of power stored in the charging unit 212. Thus, the life and performance of the charging unit 212 may be improved.

Figure 6:
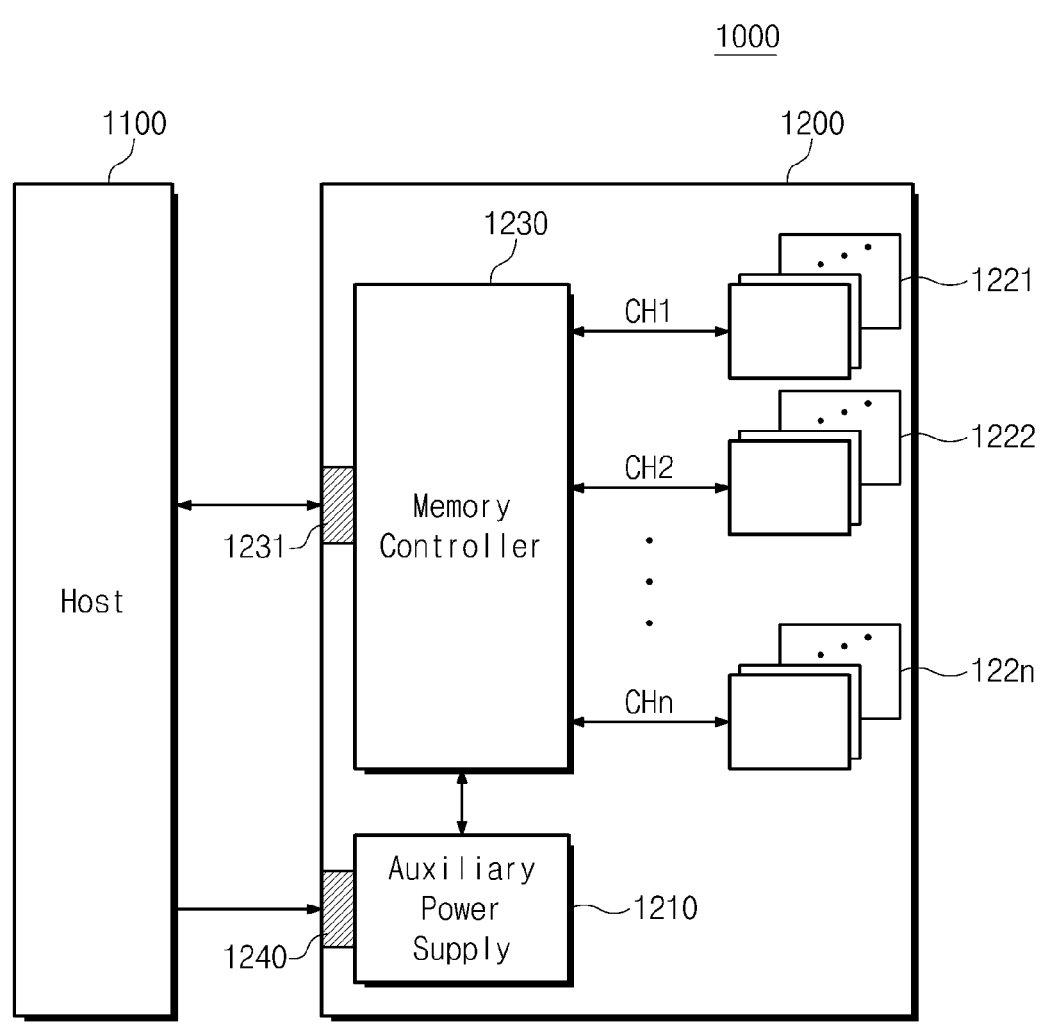
FIG. 6 is a schematic block diagram illustrating an example of a solid state drive to which a user system may be applied, according to an embodiment of the inventive concept.

FIG. 6 is a schematic block diagram illustrating an example of a solid state drive to which a user system may be applied according to an embodiment of the inventive concept. Referring to FIG. 6, a user system 1000 may include a host 1100 and an SSD 1200. The SSD 1200 may exchange signals with the host 1100 through a signal connector 1231 and receive power through a power connector 1240. The SSD 1200 may include an auxiliary power device 1210, a plurality of memory devices 1221 to 122n, and a memory controller 1230.

The auxiliary power device 1210 may be connected with the host 1100 through the power connector 1240. The auxiliary power device 1210 may perform operations of an auxiliary power device described with reference to FIGS. 1 to 5. The auxiliary power device 1210 may be placed inside or outside the SSD 1200. For example, the auxiliary power device 1210 may be placed on a main board of the host 1100 to supply auxiliary power to the SSD 1200.

The memory devices 1221 to 122n may be used as a storage medium of the SSD 1200. The memory devices 1221 to 122n may be in the form of nonvolatile memory devices such as, for example, a flash memory, a PRAM, an MRAM, a ReRAM, an FRAM, and so on. The memory devices 1221 to 122n may be connected to the memory controller 1230 through a plurality of channels CH1 to CHn. One or more of the memory devices 1221 to 122n may be connected to a channel. Memory devices connected to a channel may be connected to the same data bus.

The memory controller 1230 may exchange signals with the host 1100 through the signal connector 1231. Here, the signals may include commands, addresses, data, and so on. The memory controller 1230 may write or read data to or from a corresponding memory device according to a command of the host 1100.

The above-described auxiliary power devices may supply additional power when the level of power required by an external device (e.g., a storage device, an input device, an output device, etc.) is greater than the predetermined level. As additional power is supplied from the auxiliary power device, the burden on the peak power of the power supply may be reduced, and the performance of the system may be improved. Also, since the auxiliary power device maintains the charging voltage higher than a predetermined voltage level, the stability of a shutdown of an external device during a sudden loss of power may be secured.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:
1. A user system, comprising:
   a storage device; and
   an auxiliary power device configured to supply a power to the storage device,
   wherein the auxiliary power device comprises:
      a first one direction device configured to supply a supply voltage from an external power supply to the storage device,
      a charging unit configured to be charged by the external power supply,
      a second one direction device configured to selectively supply an output voltage of the charging unit to the storage device,
      a voltage detector configured to detect a level of the output voltage of the charging unit and to output a first control signal, and
      a switching unit connected between the charging unit and the second one direction device and configured to operate in response to a second control signal from the storage device,
   wherein the storage device is configured to output the second control signal to the switching unit in response to the first control signal.

2. The user system of claim 1, wherein the switching unit is configured to be turned on in response to the second control signal when the charging unit is charged up to a charging reference voltage.

3. The user system of claim 2, wherein when the level of the output voltage of the charging unit is higher than a level of the supply voltage, the second one direction device is configured to supply a power stored in the charging unit to the storage device.

4. The user system of claim 2, wherein the switching unit is configured to be turned off in response to the second control signal when the output voltage of the charging unit is lower than a first reference voltage.

5. The user system of claim 4, wherein the charging reference voltage is higher than the first reference voltage, the first reference voltage is higher than a second reference voltage, and the second reference voltage is a minimum voltage for an end operation of the storage device at a sudden power-off.

6. The user system of claim 5, wherein the switching unit is configured to remain turned on during the sudden power-off.

7. The user system of claim 6, wherein the switching unit is configured to turn off when the end operation of the storage device performed at the sudden power-off has been completed.

8. The user system of claim 7, wherein when the supply voltage is again supplied after the sudden power-off, the charging unit is configured to charge up to the charging reference voltage.

9. The user system of claim 1, further comprising:
a charging circuit configured to selectively adjust a level of the charging reference voltage based on an operating voltage of the storage device.

10. An auxiliary power device, comprising:
a charging unit configured to be charged up to a charging reference voltage by an external power supply;
a first one direction device configured to supply a supply voltage from the external power supply to an external device;
a second one direction device configured to selectively supply an output voltage of the charging unit to the external device;
a first voltage detector configured to detect a voltage level of the charging unit and to output a first control signal; and
a switching unit connected between the charging unit and the second one direction device and configured to operate in response to the first control signal of the first voltage detector,
wherein the first one direction device is further configured to block a current from the external device to the external power supply.

11. The auxiliary power device of claim 10, wherein the second one direction device is further configured to block a current from the external device to the charging unit.

12. The auxiliary power device of claim 10, wherein the switching unit is further configured to receive a second control signal from the external device and to operate in response to the second control signal.

13. The auxiliary power device of claim 12, further comprising a second voltage detector configured to detect a voltage level of the supply voltage and to output a third control signal.

14. The auxiliary power device of claim 10, wherein the external device is a memory controller.

15. A method of providing a power to a semiconductor device, comprising:
charging a voltage of a charging unit to a first reference voltage;
sending, to the semiconductor device, a first signal corresponding to a level of the voltage of the charging unit;
shutting a switch in response to a second signal received from the semiconductor device; and
causing a current to flow from the charging unit to the semiconductor device when the switch is shut and the voltage of the charging unit is higher than a supply voltage provided to the semiconductor device.

16. The method of claim 15, further comprising opening the switch in response to the second signal when the voltage of the charging unit is lower than a second reference voltage,
wherein the shutting the switch comprises shutting the switch in response to the second signal when the voltage of the charging unit is at the first reference voltage,
wherein the second reference voltage is lower than the first reference voltage.

17. The method of claim 15, further comprising:
determining a driving voltage of the semiconductor device.

18. The method of claim 15, further comprising:
preventing the current from flowing from the semiconductor device to the charging unit when the switch is shut and the voltage of the charging unit is lower than the driving voltage.

19. The method of claim 15, further comprising sending, to the semiconductor device, a third signal corresponding to a level of the supply voltage.

* * * * *